US011733331B1

(12) United States Patent
 Devience

(10) Patent No.: US 11,733,331 B1
(45) Date of Patent: Aug. 22, 2023

(54) HOMONUCLEAR J-COUPLING SPECTROSCOPY USING J-SYNCHRONIZED ECHO DETECTION

(71) Applicant: Stephen Devience, Windsor Mill, MD (US)

(72) Inventor: Stephen Devience, Windsor Mill, MD (US)

(73) Assignee: SCALAR MAGNETICS, LLC, Ellicott City, MD (US)

( * ) Notice: Subject to any disclaimer, the term of this patent is extended or adjusted under 35 U.S.C. 154(b) by 0 days.

(21) Appl. No.: 17/721,488

(22) Filed: Apr. 15, 2022

(51) Int. Cl.
 *G01R 33/46* (2006.01)
 *G01N 24/08* (2006.01)

(52) U.S. Cl.
 CPC ......... *G01R 33/4608* (2013.01); *G01N 24/08* (2013.01)

(58) Field of Classification Search
 CPC .............. G01N 24/08; G01R 33/4608; G01R 33/34092
 See application file for complete search history.

(56) References Cited

U.S. PATENT DOCUMENTS

| | | | | |
|---|---|---|---|---|
| 6,005,389 | A | 12/1999 | Prammer | 324/303 |
| 6,650,114 | B2 | 11/2003 | Kruspe et al. | 324/303 |
| 8,093,056 | B2 | 1/2012 | Ganesan | 436/28 |
| 10,101,423 | B2 | 10/2018 | Devience et al. | |
| 10,782,257 | B2 | 9/2020 | Kantzas et al. | |
| 11,156,685 | B2 | 10/2021 | Otvos et al. | |
| 11,231,474 | B2 | 1/2022 | Li et al. | |
| 2008/0150525 | A1* | 6/2008 | Song | G01V 3/14 324/307 |
| 2013/0193969 | A1* | 8/2013 | Grunewald | G01V 3/14 324/309 |
| 2019/0072628 | A1 | 3/2019 | Devience et al. | |

OTHER PUBLICATIONS

S. J. Devience, M. Greer, S. Mandal, M. S. Rosen, Homonuclear J-Coupling Spectroscopy at Low Magnetic Fields Using Spin-Lock Induced Crossing, *ChemPhysChem*, 2021, 22, 2128-2137, Wiley-VCH GmbH, Germany.
S. J. Devience, M. S. Rosen, R. L. Walsworth, Preparation of Nuclear Spin Singlet States Using Spin-Lock Induced Crossing, *Phys. Rev. Lett.*, 2013, 111, 173002, American Physical Society, College Park, MD.

(Continued)

*Primary Examiner* — Jay Patidar
(74) *Attorney, Agent, or Firm* — Stein IP, LLC

(57) ABSTRACT

A method and a device for performing homonuclear J-coupling spectroscopy on a sample, the method including: a) producing transverse magnetization in the sample by applying an RF excitation pulse at a nuclear magnetic resonance (NMR) frequency; b) after a delay τ, applying a refocusing pulse to the sample; c) performing a step of, applying another refocusing pulse to the sample after a delay 2τ, N times, where N ranges from $N_{min}$ to $N_{max}$; d) following a final one of the refocusing pulses, acquiring an NMR signal from the sample; and repeating steps a)-c) for different values of N, adjusting τ so that a total time $T=2(N+1)\tau$ remains constant, where T is a time between a start of the RF excitation pulse and a center or a start of a final one of the NMR signals.

32 Claims, 16 Drawing Sheets

(56) References Cited

OTHER PUBLICATIONS

S. J. Devience, M. S. Rosen, Manipulating Singlet Order by Spin-Lock Induced Crossing, in *Long-lived Nuclear Spin Order: Theory and Applications* (Ed. Giuseppe Pileio), The Royal Society of Chemistry, UK, 2020, pp. 151-168.
D. A. Barskiy, O. G. Salnikov, A. S. Romanov, M. A. Feldman, A. M. Coffey, K. V. Kovtunov, I. V. Koptyug, E. Y. Chekmenev, NMR Spin-Lock Induced Crossing (SLIC) dispersion and long-lived spin states of gaseous propane at low magnetic field (0.05T), *J. Magn. Reson.*, 2017, Elsevier, Netherlands.
G. Pileio, M. Carravetta, M. H. Levitt, Storage of nuclear magnetization as long-lived singlet order in low magnetic field, *Proc. Natl. Acad. Sci. U.S.A.*, 2010, 107, 17135-17139, National Academy of Sciences, Washington, DC.
M. C. D. Tayler, M. H. Levitt, Singlet nuclear magnetic resonance of nearly-equivalent spins, *Phys. Chem. Chem. Phys.*, 2011, 13, 5556-5560, The Royal Society of Chemistry, UK.
R. Freeman, H. D. W. Hill, High-Resolution Study of NMR Spin Echoes: "J Spectra", *J. Chem. Phys.*, 1971, 54, 301-313, AIP Publishing LLC, Melville, NY.
L. M. Pham, S. J. Devience, F. Casola, I. Lovchinsky, A. O. Sushkov, E. Bersin, J. Lee, E. Urbach, P. Cappellaro, H. Park, A. Yacoby, M. Lukin, R. L. Walsworth, NMR technique for determining the depth of shallow nitrogen-vacancy centers in diamond, *Phys. Rev. B*, 2016, 93, 045425, American Physical Society, College Park, MD.
S. J. Devience, L. M. Pham, I. Lovchinsky, A. O. Sushkov, N. Bar-Gill, C. Belthangady, F. Casola, M. Corbett, H. Zhang, M. Lukin, H. Park, A. Yacoby, R. L. Walsworth, Nanoscale NMR spectroscopy and imaging of multiple nuclear species, *Nature Nanotech*, 2015, 10, 129-134, Springer Nature, UK.
G. De Lange, D. Ristè, V. V. Dobrovitski, R. Hanson, Single-Spin Magnetometry with Multiple Sensing Sequences, *Phys. Rev. Lett.*, 2011, 106, 080802, American Physical Society, College Park, MD.
T. K. Karamanos, A. P. Kalverda, G. S. Thompson, S. E. Radford, Mechanisms of amyloid formation revealed by solution NMR, *Prog. Nucl. Magn. Reson. Spectrosc.*, 2015, 88-89, 86-104, Elsevier, Netherlands.
S. Meiboom, D. Gill, Modified Spin-Echo Method for Measuring Nuclear Relaxation Times, *Rev. Sci. Intsrum.*, 1958, 29, 688, AIP Publishing LLC, Melville, NY.
M. Sarracanie, C. D. Lapierre, N. Salameh, D. E. J. Waddington, T. Witzel, M. S. Rosen, Low-Cost High-Performance MRI, *Sci. Rep.*, 2015, 5, 15177, Springer Nature, UK.
M. C. D. Tayler, T. Theis, T. F. Sjolander, J. W. Blanchard, A. Kentner, S. Pustelny, A. Pines, D. Budker, Instrumentation for nuclear magnetic resonance in zero and ultralow magnetic field, *Rev. Sci. Intsrum.*, 2017, 88, 091101, AIP Publishing LLC, Melville, NY.

T. Theis, J. W. Blanchard, M. C. Butler, M. P. Ledbetter, D. Budker, A. Pines, Chemical analysis using J-coupling multiplets in zero-field NMR, *Chem. Phys. Lett.*, 2013, 580, 160-165, Elsevier, Netherlands.
S. Appelt, H. Kühn, F. W. Häsing, B. Blümich, Chemical analysis by ultrahigh-resolution nuclear magnetic resonance in the Earth's magnetic field, *Nat. Phys.*, 2006, 2, 105-109, Springer Nature, UK.
S. Appelt, F. W. Häsing, H. Kühn, B. Blümich, Phenomena in J-coupled nuclear magnetic resonance spectroscopy in low magnetic fields, *Phys. Rev. A*, 2007, 76, 023420, American Physical Society, College Park, MD.
S. Appelt, F. W. Häsing, U. Sieling, A. Gordji-Nejad, S. Glöggler, and B. Blümich, Paths from weak to strong coupling NMR, *Phys. Rev. A*, 2010, 81, 023420, American Physical Society, College Park, MD.
D. Ha, J. Paulsen, N. Sun, Y.-Q. Song, D. Ham, Scalable NMR spectroscopy with semiconductor chips, *Proc. Natl. Acad. Sci. U.S.A.*, 2014, 111, 11955-11960, National Academy of Sciences, Washington, DC.
S. Z. Kiss, N. MacKinnon, J. G. Korvink, Microfluidic Overhauser DNP chip for signal-enhanced compact NMR, *Sci. Rep.*, 2021, 11, 4671, Springer Nature, UK.
D. Ariando, C. Chen, M. Greer, S. Mandal, An autonomous, highly portable NMR spectrometer based on a low-cost System-on-Chip (SoC), *J. Magn. Reson.*, 2019, 299, 74-92, Elsevier, Netherlands.
M. V. S. Elipe, R. R. Milburn, Monitoring chemical reactions by low-field benchtop NMR at 45 MHz: pros and cons, *Magn. Reson. Chem.*, 2015, 54, 437-443, Wiley-VCH GmbH, Germany.
S. D. Riegel, G. M. Leskowitz, Benchtop NMR spectrometers in academic teaching, *Trends Analyt. Chem.*, 2016, 83, 27-38, Elsevier, Netherlands.
H. Metz, K. Mäder, Benchtop-NMR and MRI—a new analytical tool in drug delivery research, *Int. J. Pharm.*, 2008, 364, 170-175, Elsevier, Netherlands.
R. Freedman, V. Anand, B. Grant, K. Ganesan, P. Tabrizi, R. Torres, D. Catina, D. Ryan, C. Borman, C. Kruecki, A compact high-performance low-field NMR apparatus for measurements on fluids at very high pressure and temperatures, *Rev. Sci. Instrum.* 2014, 85, 025102, AIP Publishing LLC, Melville, NY.
T. Rudszuck, E. Förster, H. Nirschl, G. Guthausen, Low-field NMR for quality control on oils, *Magn. Reson. Chem.* 2019, 57, 777-793, Wiley-VCH GmbH, Germany.
D. B. Bucher, D. R. Glenn, H. Park, M. D. Lukin, R. L. Walsworth, Hyperpolarization-Enhanced NMR Spectroscopy with Femtomole Sensitivity Using Quantum Defects in Diamond, *Phys. Rev. X*, 2020, 10, 021053, American Physical Society, College Park, MD.
D. R. Glenn, D. B. Bucher, J. Lee, M. D. Lukin, H. Park, R. L. Walsworth, High-resolution magnetic resonance spectroscopy using a solidstate spin sensor, *Nature*, 2018, 555, 351-354, Springer Nature, UK.

\* cited by examiner

Prior Art

Prior Art

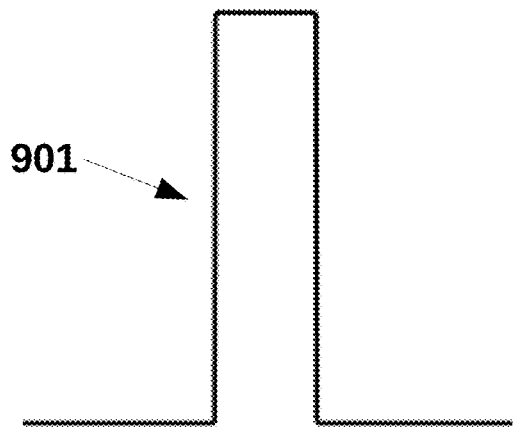
FIG. 9A Rectangular
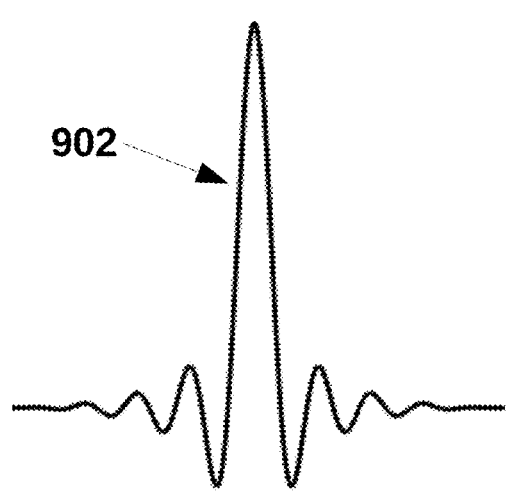
FIG. 9B Sinc
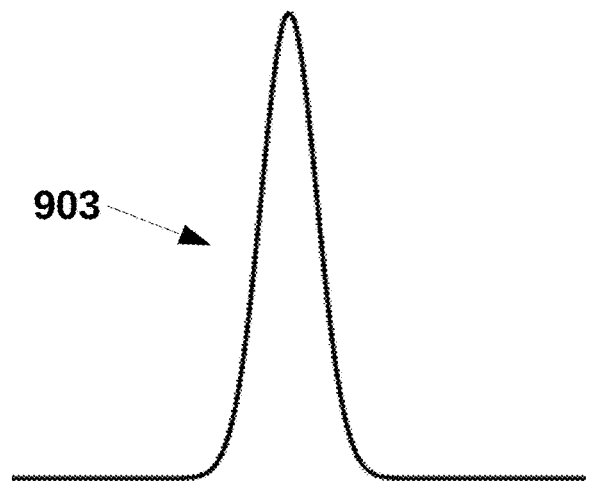
FIG. 9C Gaussian
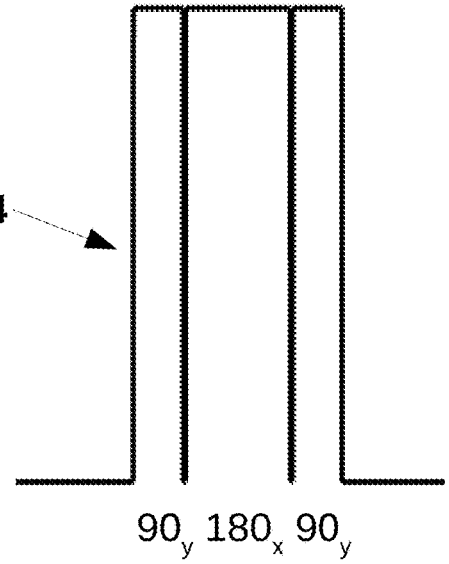
FIG. 9D Composite
$90_y$ $180_x$ $90_y$ FIDs N=0    N=1    N=k    N=N$_{max}$ Fourier Transform Spectra Integrate I(0)   I(1)   I(k)   I(N$_{max}$)

J-coupling Spectrum

Plot $\nu_n(N)$

Normalize

Normalized J-coupling Spectrum $\nu_n(N)$

FIG. 11A
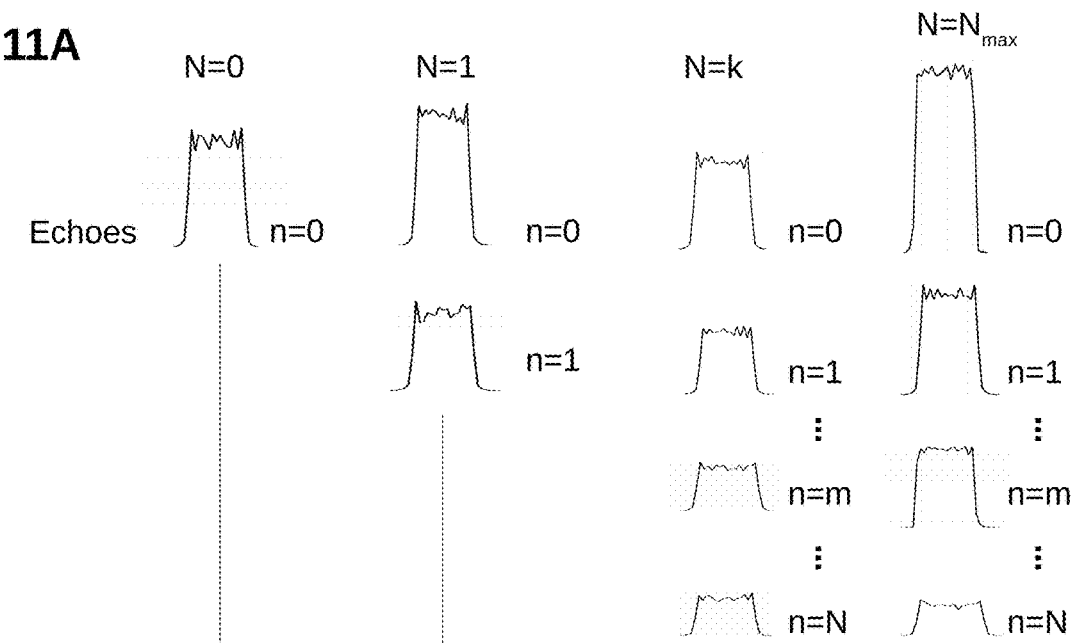
FIG. 11B
FIG. 11C
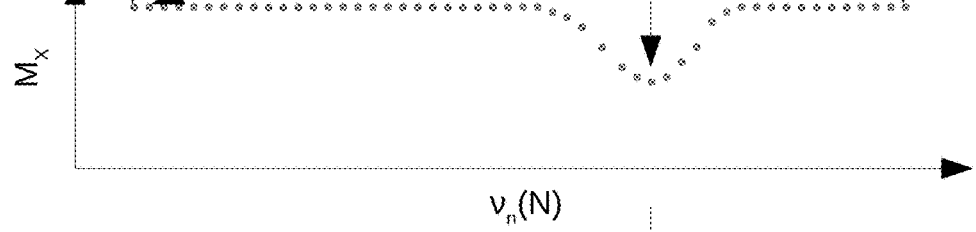
FIG. 11D
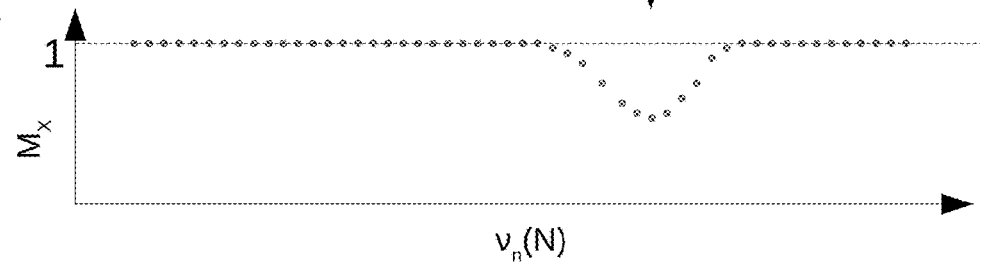

HOMONUCLEAR J-COUPLING SPECTROSCOPY USING J-SYNCHRONIZED ECHO DETECTION

BACKGROUND OF THE INVENTION

1. Field of the Invention

Aspects of the present invention relate to homonuclear J-coupling spectroscopy, wherein nuclear magnetic resonance (NMR) can be performed at lower magnetic fields than what was previously obtainable.

2. Description of the Related Art

Nuclear magnetic resonance (NMR) devices and methods have been around for about 70 years.

Just by way of example, some typical uses for NMR include the following:
  a. Identification of a chemical via its unique NMR spectrum;
  b. Quantification of multiple chemicals in a mixture;
  c. Determination of molecular structure; and
  d. Quantification of chemical exchange via spectral changes.

This technology is implemented, by way of example, in the chemical industry, pharmaceutical industry, academic research, and medical imaging and diagnostics. The technology may also be used in other fields as well.

NMR has been/is and will be utilized in NMR spectrometers, NMR analyzers, NMR relaxometers, and magnetic resonance imagers (MRI), as well as other devices.

All of the above applications can be performed with conventional high-field NMR, but they all require a relatively large, heavy magnet.

Conventional NMR devices and methods require strong heavy magnets because the spectral pattern that a chemical compound creates depends on the strength of a static magnetic field in which the compound is present (measured in Tesla, T). This applies for any type of compound.

FIG. 1 shows a conventional proton NMR spectrum of ethanol at magnetic fields from 6.5 mT to 4.7 T. At high magnetic fields, such as 4.7 T, the spectrum exhibits a pattern with one multiplet 101 arising from a methylene group and another multiplet 102 arising from the methyl group. The pattern and locations of the peaks are functions of the particular chemical shifts and scalar couplings unique to ethanol's protons, and so the spectrum can be used to identify the compound as ethanol.

At low fields, such as at 6.5 mT, the proton spectrum is just a single line 103. The proton spectrum of most other compounds is also a single line at 6.5 mT, so there is no way to tell the compounds apart, determine their structure, etc., from the spectrum. Thus, important information such as the scalar couplings and chemical shifts is not observable.

A "low field" may be indicated as $\Delta\nu \ll J$, where $\Delta\nu$ is the frequency difference between protons induced by the chemical shift and J is the scalar coupling between the protons, meaning the frequency differences are significantly smaller than the scalar couplings. For ethanol, this is ~50 mT and below, but for some chemicals it could be 500 mT and below. Most will be covered by the <50 mT range.

The above technology is focused on $^1H$ (proton) NMR, but the same could also work for other spin-1/2 nuclei like $^{19}F$, $^{31}P$, $^{15}N$, $^{13}C$, etc.

To create easily interpreted spectra, NMR spectroscopy is typically performed under weak coupling conditions where the chemical shift frequency differences $\Delta\nu$ are significantly larger than the scalar couplings J, i.e., $\Delta\nu \gg J$. However, magnetic fields greater than 1 T are typically required to create sufficient frequency dispersion. The ability to acquire high-resolution spectra at lower magnetic fields would be advantageous in many situations, such as for benchtop and educational instruments, portable operations for oil-field exploration, spectroscopy in the presence of ferromagnetic and paramagnetic substances, optically-detected NMR with nitrogen vacancies as sensors, and chip-scale spectrometers. Unfortunately, as field strength is reduced, spectral information becomes difficult to interpret and is eventually lost, because under low-field conditions, the NMR spectrum of any homonuclear spin system exhibits only a single dominant spectral line.

Previously, another form of NMR spectroscopy that works at low magnetic fields and produces unique J-coupling spectra for many compounds was developed. A pulse sequence as shown in FIG. 2 is performed multiple times on a sample. Following an initial RF excitation pulse 201 that creates transverse magnetization ($M_x$), a weak continuous-wave (CW) spin-locking pulse (SLIC pulse) 202 is played out for a time T. A free-induction decay (FID) signal 203 is then acquired. The pulse sequence is repeated each time, increasing the amplitude of the SLIC pulse 202. When the measured signal vs. spin-locking amplitude is plotted, a spectrum of dips is determined, which is unique for each compound.

An example of a homonuclear J-coupling spectrum for ethyl acetate created with SLIC is shown in FIG. 3. The measured spectrum was acquired at 6.5 mT ($^1H$ NMR frequency 276 kHz) using an SLIC pulse duration of T=1 second. Simulations show that for ethyl acetate, dips should occur at values $(3/2)J_{BC}$ and $(5/2)J_{BC}$, where $J_{BC}$ is the scalar coupling between protons of groups B and C in the compound. The measured spectrum exhibits dips at 10.65 Hz= $(3/2)J_{BC}$ and 17.75 Hz=$(5/2)J_{BC}$, from which a value $J_{BC}$=7.1 Hz is obtained.

Some issues relating to the above form of NMR spectroscopy include signal sensitivity not being very high and imperfections and fluctuations in a static magnetic field $B_0$ and a time-varying radiofrequency magnetic field $B_1$ can lead to noise and reduced signal strength. For SLIC, $B_0$ had to be kept very stable. It was previously shown that one can enable homonuclear spectroscopy at low field strengths by introducing a form of J-coupling spectroscopy using the spin-lock induced crossing (SLIC) sequence. SLIC detects level anti-crossings created whenever there is at least one chemical shift difference among the spins. In SLIC, an RF excitation pulse 201 is used to create transverse magnetization ($M_x$), and very weak spin-locking (the SLIC pulse 202) is applied to the sample, and a free-induction decay (FID) signal 203 is acquired. Measurements are repeated for a series of spin-lock amplitudes to create a J-coupling spectrum by plotting FID intensity as a function of spin-lock nutation frequency. Dips in FID intensity indicate the positions of the level anti-crossings, which in turn are a reflection of the J-couplings within the compound. Unfortunately, this procedure is slow and suffers from drawbacks such as sensitivity to $B_0$ and $B_1$ offsets and instability. It is also difficult to extend the technique to two dimensions, for example, to simultaneously measure the dependence on spin-locking time and nutation frequency, since the acquisitions must be completely repeated along the time dimension.

SUMMARY OF THE INVENTION

Aspects of the present invention relate to homonuclear J-coupling spectroscopy, wherein nuclear magnetic resonance (NMR) can be performed at lower magnetic fields than what was previously obtainable.

Homonuclear J-coupling spectroscopy enables NMR to be performed without requiring relatively large, heavy magnets, but instead is capable of the same or better performance at low magnetic fields.

Consequently, it becomes possible to make a small, portable spectrometer, a spectrometer on a chip, and instruments that work in the presence of ferromagnetic materials.

Pulse sequences extract spectral information at low fields to be used in the above applications and/or devices.

According to an aspect of the present invention, there is a method of performing homonuclear J-coupling spectroscopy on a sample, the method comprising:
  a) producing transverse magnetization in the sample by applying an RF excitation pulse at a nuclear magnetic resonance (NMR) frequency;
  b) after a delay τ, applying a refocusing pulse to the sample;
  c) performing a step of, applying another refocusing pulse to the sample after a delay 2τ, N times, where N ranges from $N_{min}$ to $N_{max}$
  d) following a final one of the refocusing pulses, acquiring an NMR signal from the sample; and
  repeating steps a)-c) for different values of N, adjusting τ so that a total time T=2(N+1)τ remains constant, where T is a time between a start of the RF excitation pulse and a center or a start of a final one of the NMR signals.

According to another aspect of the present invention, there is a nuclear magnetic resonance frequency (NMR) device, comprising:
  a pulse sequence generator;
  a radio frequency (RF) coil;
  a detector; and
  a processor configured to:
    control the pulse generator to send a pulse transmission to the RF coil to cause the RF coil to:
    a) apply an RF excitation pulse to the sample at a nuclear magnetic resonance (NMR) frequency to produce transverse magnetization in the sample;
    b) after a delay τ, apply a refocusing pulse to the sample;
    c) perform a step of, applying another refocusing pulse to the sample after a delay 2τ, N times, where N ranges from $N_{min}$ to $N_{max}$;
    d) following a final one of the refocusing pulses, the detector acquires an NMR signal from the sample using the RF coil; and
    repeating steps a)-c) for different values of N, adjusting τ so that a total time T=2(N+1)τ remains constant, where T is a time between a start of the RF excitation pulse and a center or a start of a final one of the NMR signals.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which:

FIGS. 9A-9D show rectangular, sinc, Gaussian and composite shapes, respectively, of refocusing pulses according to the first and second embodiments, wherein these shapes can be used for any of the pulses.

FIGS. 11A-11D show the procedure for creating a J-coupling spectrum from echo signals acquired for each number N of additional refocusing pulses according to the second embodiment;

DETAILED DESCRIPTION OF THE EMBODIMENTS

Figure 1:
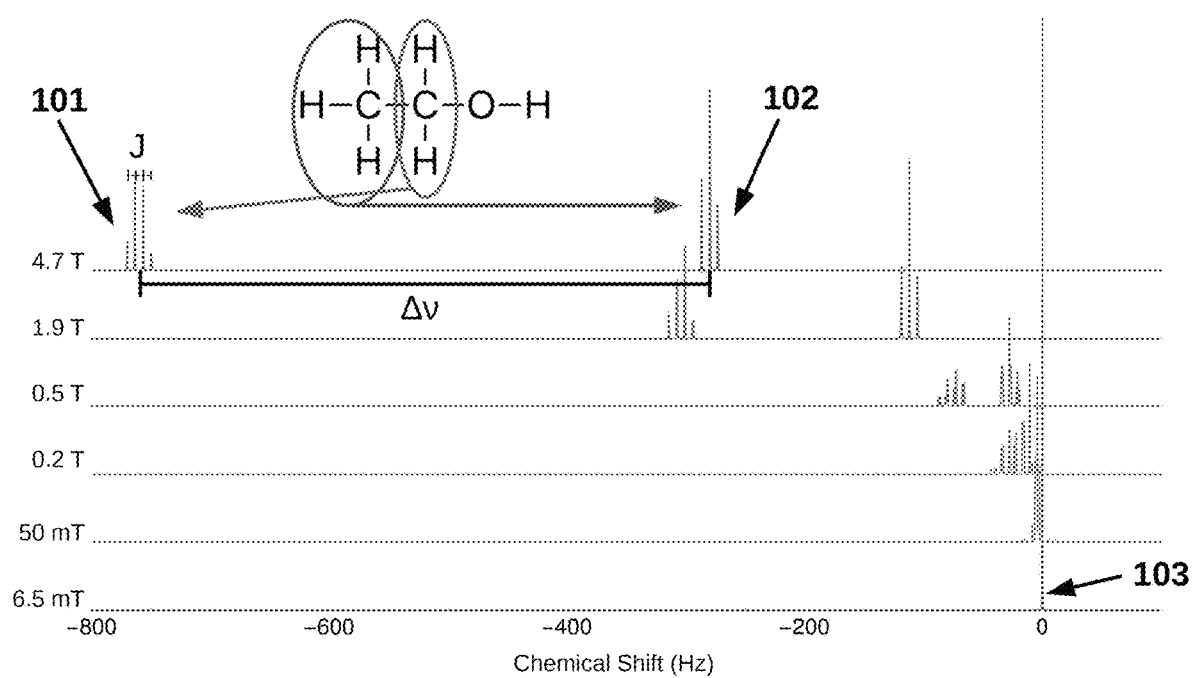
FIG. 1 shows a conventional proton NMR spectrum of ethanol at magnetic fields from 6.5 mT to 4.7 T.

Reference will now be made in detail to the present embodiments of the present invention, examples of which are illustrated in the accompanying drawings, wherein like reference numerals refer to the like elements throughout.

The embodiments are described below in order to explain the present invention by referring to the figures.

According to aspects of the present invention, homonuclear J-coupling spectroscopy is used to perform nuclear magnetic resonance (NMR) at lower magnetic fields than what was previously obtainable.

Consequently, it becomes possible to make a small, portable spectrometer, a spectrometer on a chip, and instruments that work in the presence of ferromagnetic materials.

For the related art SLIC, $B_0$ had to be kept very stable, but the embodiments of the present invention have less stringent requirements. When the second embodiment is used, an achieved signal-to-noise is thirty (30) times better with the new sequence than with SLIC, resulting in a major improvement over the related art.

Figure 4:
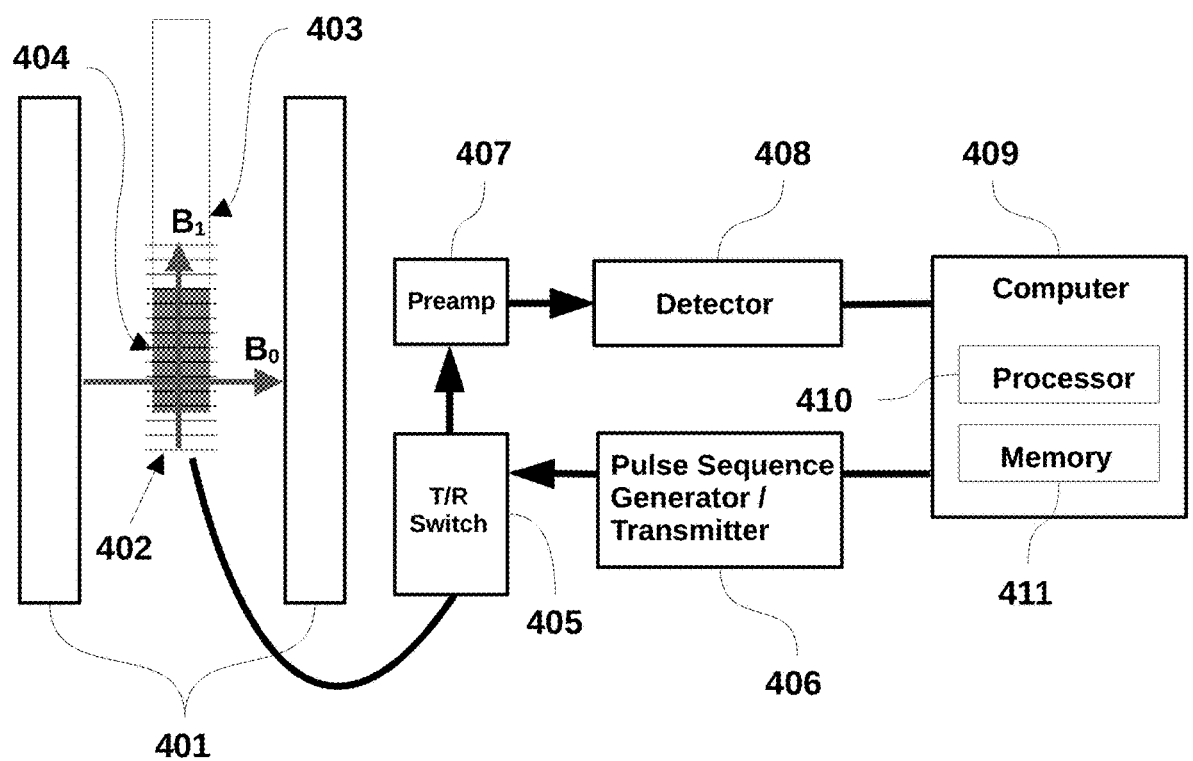
FIG. 4 is a block diagram of a nuclear magnetic resonance (NMR) apparatus used in conjunction with methods according to first and second embodiments of the present invention.

FIG. 4 is a block diagram of an NMR apparatus 400 according to an aspect of the present invention. One or more magnets 401 produce a static magnetic field ($B_0$). An RF coil 402 produces a time-varying radiofrequency magnetic field ($B_1$) and detects a time-varying magnetic field from a sample 404. A sample holder 403 contains the sample 404 within the RF coil 402. A transmit/receive switch 405 connects the RF coil 402 with a pulse sequence generator 406 and a preamplifier 407. During pulse transmission, the signal from the pulse sequence generator 406 is sent to the RF coil 402. During signal acquisition, the signal detected by the RF coil 402 is sent to the preamplifier 407 and then to a detector 408. The detector 408 may be a radio receiver connected to the RF coil 402 to record the NMR signal. Other types of detectors, by way of example, may be diamonds with nitrogen vacancy centers or rubidium magnetometers, that do the detection in a different way. These detectors go in or near the sample 404 and wouldn't be connected to the RF coil 402.

The pulse sequence generator 406 in this instance is an RF signal generator that generates pulses which are provided to the RF coil 402 with the times, amplitudes, and phases programmed by a computer 409.

The preamplifier 407 amplifies the signals induced in the RF coil 402 by the sample 404 and passed to the preamplifier 407 by the transmit/receive switch 405. The preamplifier 407 then sends the amplified signal to the detector 408.

The detector 408 in this instance is a radio receiver that records the signal and sends the recording to the computer 409.

The computer 409 controls pulse generation and records and processes the response from the detector 408. The computer 409 includes a processor 410 and a memory 411.

A function of the computer 409 may be implemented by a processor 410 including at least one of electronic units such as an application-specific integrated circuit (ASIC), a digital signal processor (DSP), a programmable logic device (PLD), a field programmable gate array (FPGA), a controller, a microcontroller, and/or a microprocessor, or may be implemented by a software module that performs at least one function or operation, collectively known as processors. The software module may be implemented by using a software program compiled by using any appropriate software language. The software program may be stored in the memory 411 in a mobile device or a network, and is read and executed by the processor 410. The computer 409 may be a general-purpose computer, a dedicated computer, a computer network, or another programmable apparatus.

The processor 410 controls the transmit/receive switch 405 to be in a transmit or receive mode and the processor 410 controls the times at which the detector 408 records the signals. It is noted that there are ways to control the transmit/receive switch 405 even without computer control.

The memory 411 may be one or more of the following types: a flash (flash) memory, a memory of a hard disk type, a memory of a micro multimedia card type, a card-type memory (for example, a secure-digital (SD) or extreme-digital (XD memory), a random access memory (RAM), a static random access memory (SRAM), a read-only memory (ROM), an electrically erasable programmable read-only memory (EEPROM), a programmable read-only memory (PROM), or a magnetic memory.

With respect to the NMR apparatus 400, spectra at 276 kHz (6.5 mT) are measured in a custom-built high-homogeneity electromagnet-based MRI scanner with a Tecmag Redstone™ console, only by way of example. Other consoles and devices may be used as well. For the presently described first and second embodiments, the RF coil 402, which is a solenoidal sample coil, was used, designed to hold 10 mm NMR tubes 403 and a $B_0$ field-frequency lock was used to maintain the resonance frequency within ±0.25 Hz. $B_0$ was shimmed to achieve a linewidth of deionized water of better than 0.5 Hz. RF pulses having a 90° pulse length of 1 ms using about 4 μW of power.

Figure 2:
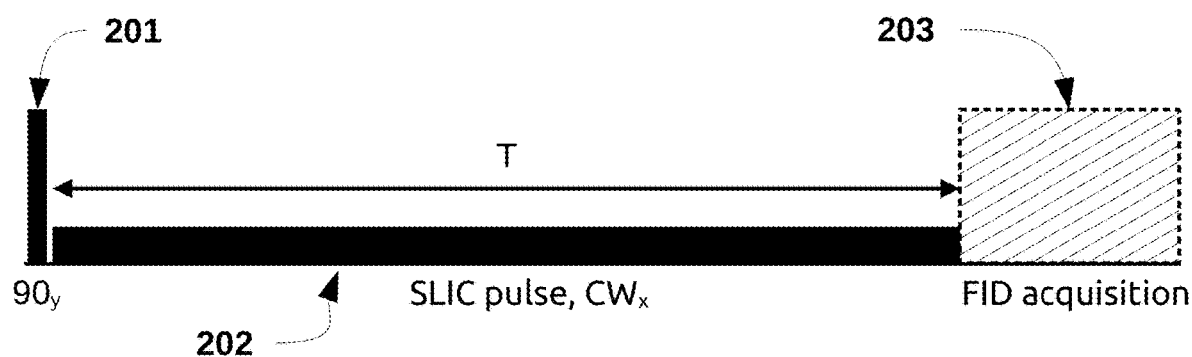
FIG. 2 shows a pulse sequence of another form of NMR spectroscopy that works at low magnetic fields and produces unique J-coupling spectra for many compounds.

The present inventors figured out that a long CW SLIC pulse in the sequence shown in FIG. 2 can be replaced by a train of refocusing pulses.

Figure 5A:
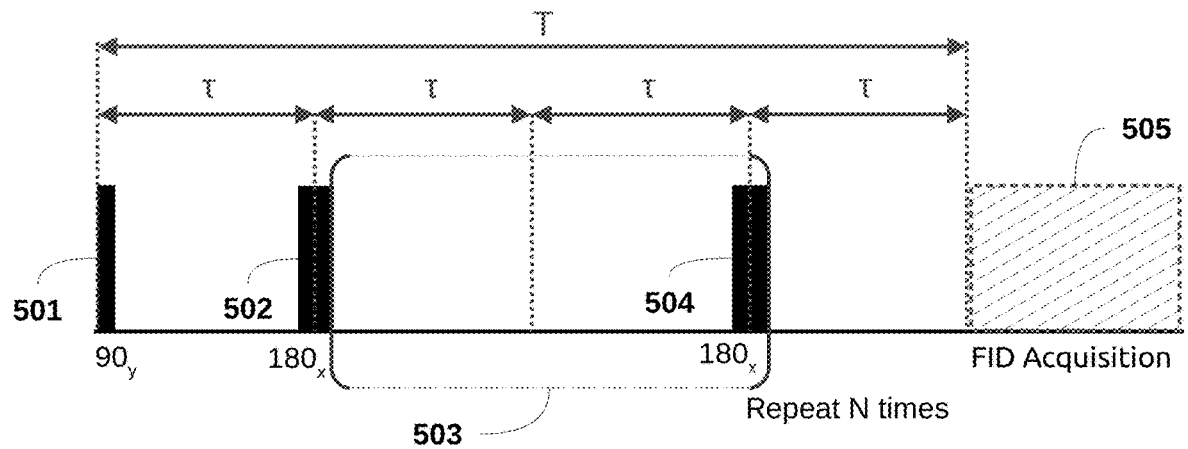
FIG. 5A shows a pulse sequence for producing homonuclear J-coupling spectra according to the first embodiment.
Figure 5B:
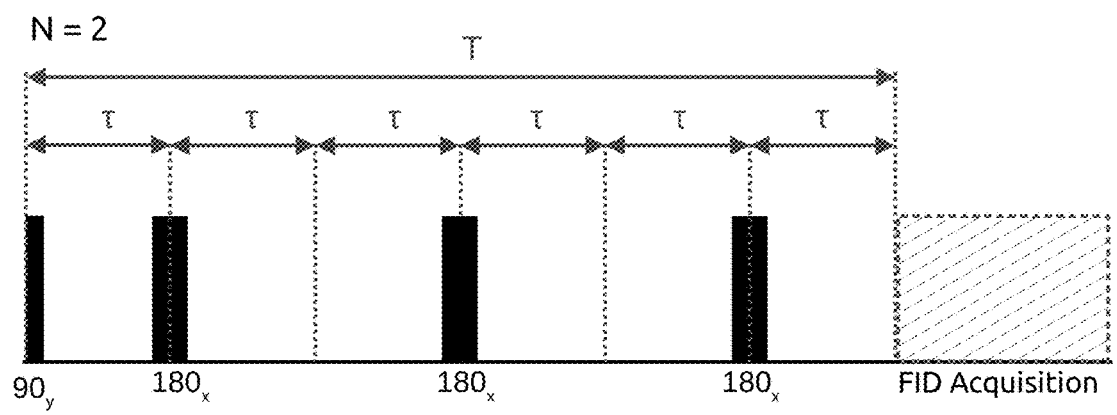
FIG. 5B shows a pulse sequence like that shown in FIG. 5A except a number of refocusing pulses is 2 rather than 1.
Figure 5C:
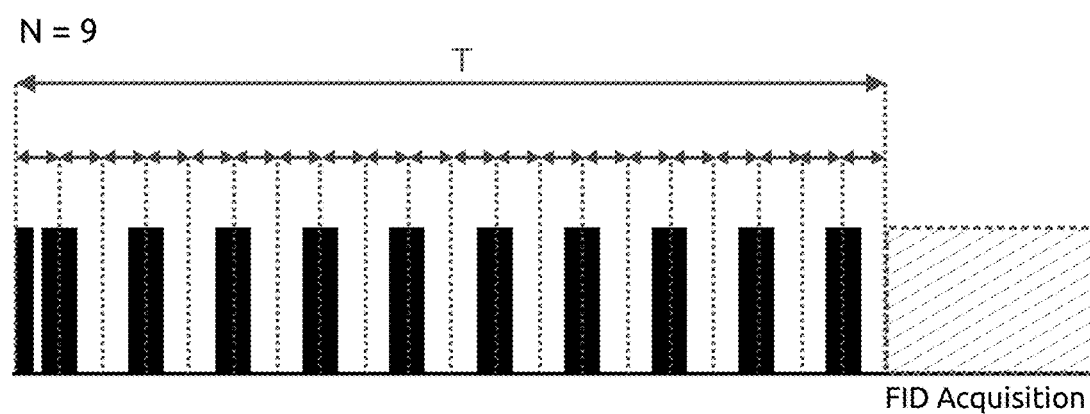
FIG. 5C shows a pulse sequence like that shown in FIG. 5A except a number of refocusing pulses is 9 rather than 1.
Figure 6:
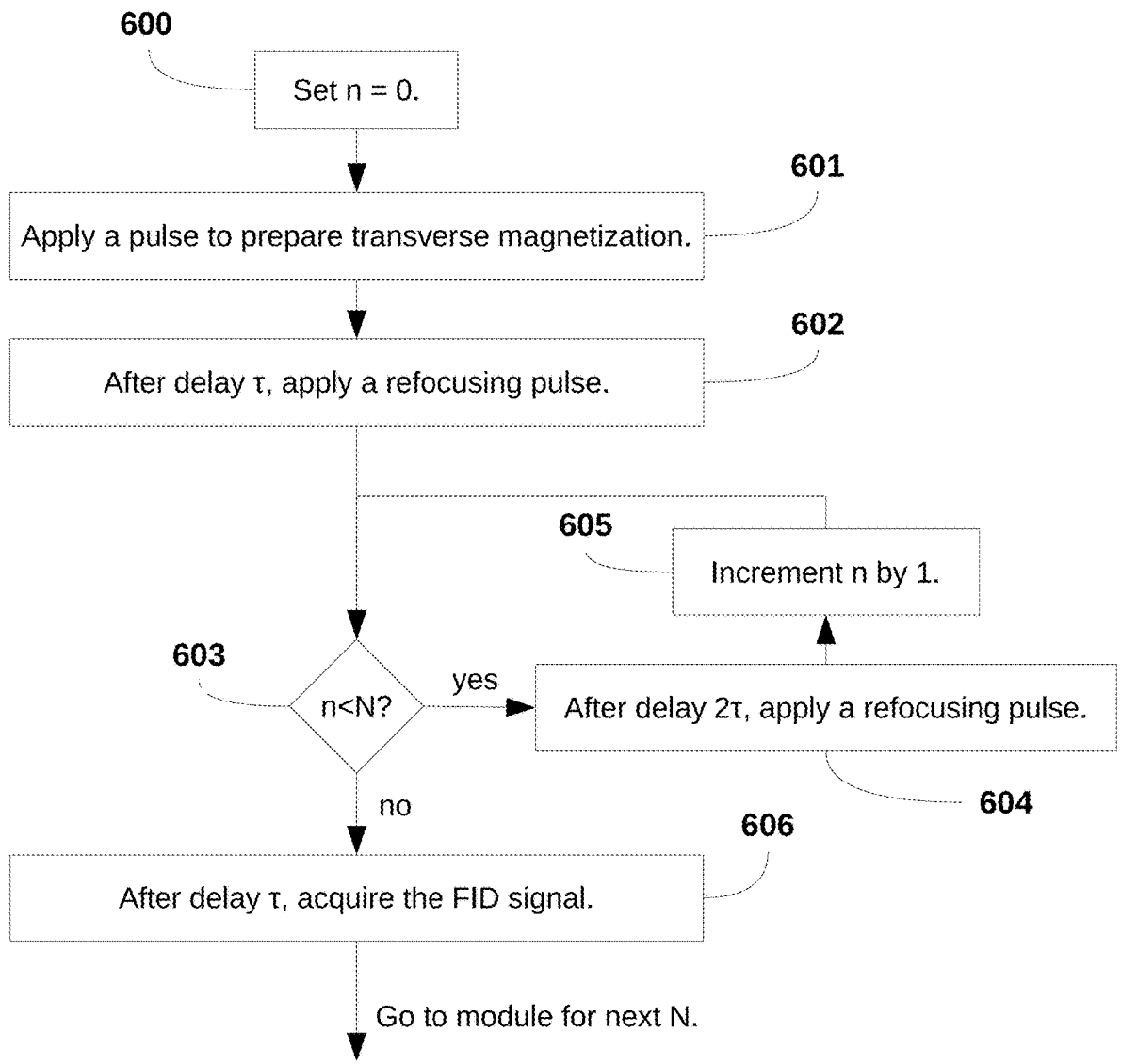
FIG. 6 is a flowchart to show the steps for pulse sequencing of FIGS. 5A-5C.

FIGS. 5A-6 show a first embodiment of a pulse sequence for producing homonuclear J-coupling spectra, in which an SLIC pulse 202 is replaced with pulse trains 502 and 503.

As shown in FIG. 5A, a J-synchronized echo module is repeated each time with a different number N of refocusing sub-modules 503. The lowest $N_{min}$ can be is 0, but sometimes N can start with a value higher than zero if one is only interested in a certain range of spectral frequencies. An RF excitation pulse 501 is first applied to the sample 404 to create transverse magnetization ($M_x$). Following a delay τ, a refocusing pulse 502 is applied to the sample 404. Next, a refocusing sub-module 503 including a 2τ delay and a refocusing pulse 504 is repeated N times. The NMR signal is then acquired. In one example, following a final delay τ, an NMR free-induction decay (FID) signal (an NMR signal) 505 is acquired. The acquisition could be started anywhere after the last pulse. A good time to start, but only by way of example, is after another delay τ.

The delay time τ is adjusted so that a total time between the start of the first pulse and the start of the FID acquisition remains a constant length T=2(N+1)τ. Here the length T corresponds with the length T of the SLIC pulse 202 of FIG. 2. FIG. 5B shows an example of the J-synchronized echo module with N=2, and FIG. 5C shows an example of the J-synchronized echo module with N=9.

A maximum number of repetitions, $N_{max}$, for the refocusing sub-module 503 can be as high as a few hundred.

The pulse sequencing works as follows as shown FIG. 6.

First, as shown in operation 600, a counter n is set to 0.

As shown in operation 601, the RF excitation pulse 501 is applied to the sample 404 at the NMR frequency to create transverse magnetization ($M_x$). The sample 404 may be a liquid or solution in a sample tube, like a test tube, or the sample 404 might be tissue samples or this process can be done as part of an MRI on a person. It is contemplated that other types of samples may also be used.

As shown in operation 602, after a delay τ, a refocusing pulse 502 is applied to the sample 404 at the NMR frequency.

As shown in operation 603, a decision is made. If the counter n is less than N, then operation 604, the refocusing sub-module 503, is performed. The refocusing sub-module is a delay $2\tau$ which is followed by a refocusing pulse 504. Following operation 604, the counter n is incremented by 1 (operation 605) and operation 603 is repeated.

In operation 603, if/when the counter n is not less than N, then operation 606 is carried out.

In operation 606, after a final delay $\tau$, a free acquisition decay (FID) signal 505 is acquired. For the apparatus shown in FIG. 4, this occurs when the T/R switch 405 is in receive mode, and the current induced in the coil 402 by the sample 404 is amplified by the preamplifier 407 and detected by the detector 408.

Here, the RF excitation pulse 501 has a flip angle $\alpha=90°$ and the refocusing pulses 502, 504 have a flip angle $\alpha=180°$. However, this is not the only possible combination. For example, the first pulse 501 could use a flip angle $\alpha<90°$.

The pulses can be simple rectangular pulses as shown in FIG. 9A, shaped pulses as shown in FIGS. 9B and 9C, or composite pulses as shown in FIG. 9D. In the composite pulse as shown in FIG. 9D, multiple pulses produce the same effect as a single pulse.

Here, a phase of all of the refocusing pulses 502, 504 is shifted 90° from that of the RF excitation pulse 501. For example, if the RF excitation pulse 501 has phase y, subsequent pulses have phase x. However, this is not the only possible combination. For example, the phase of the refocusing pulses could also be equal to the phase of the RF excitation pulse 501.

Figure 7A:
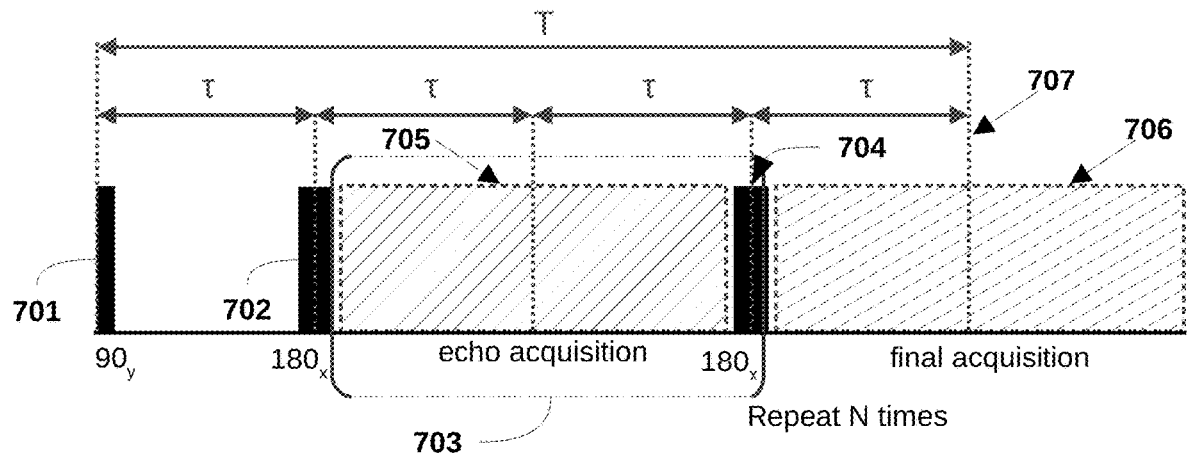
FIG. 7A shows a pulse sequence for producing homonuclear J-coupling spectra according to a second embodiment.
Figure 7B:
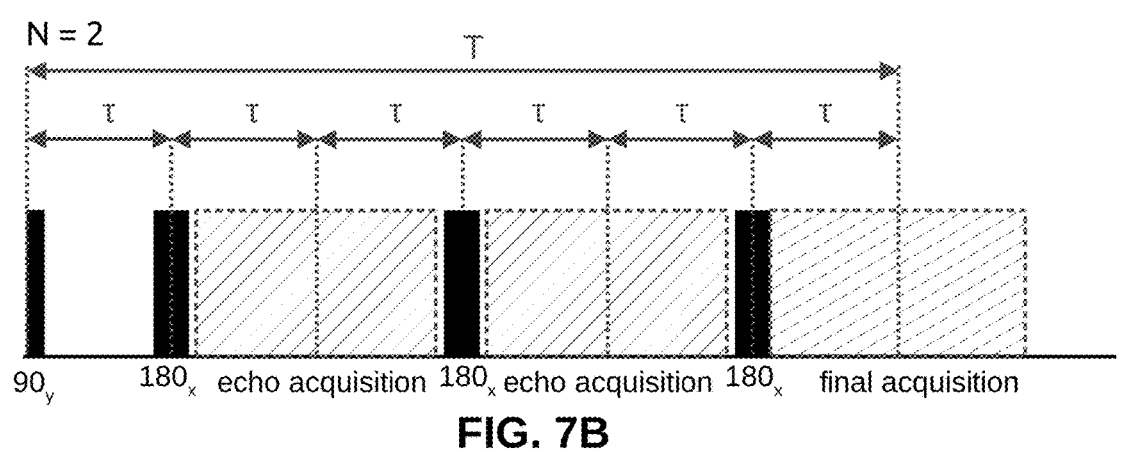
FIG. 7B shows a pulse sequence like that shown in FIG. 7A except a number of refocusing pulses is 2 rather than 1.
Figure 7C:
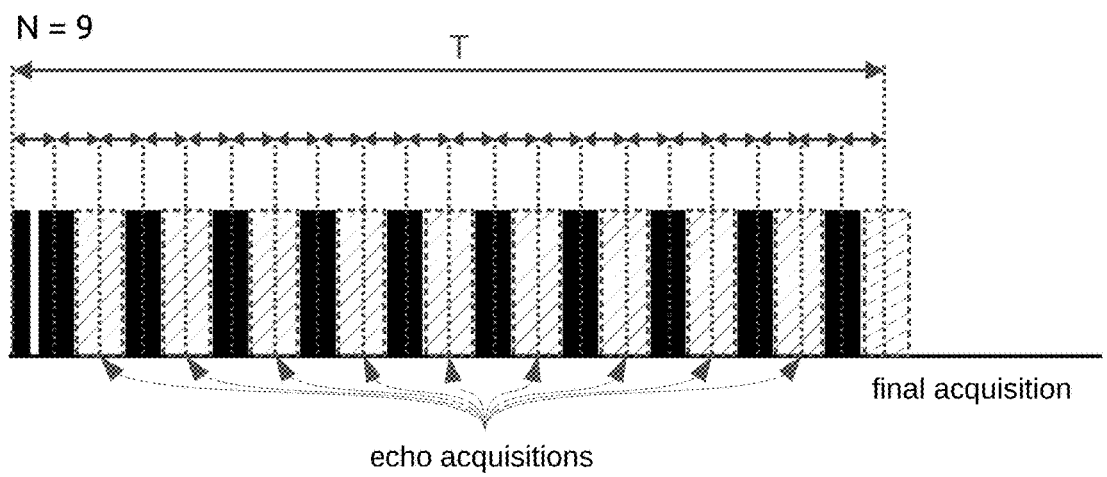
FIG. 7C shows a pulse sequence like that shown in FIG. 7A except a number of refocusing pulses is 9 rather than 1.

In a second embodiment as shown in FIGS. 7A-7D, echoes are acquired during a refocusing sub-module 703. A J-synchronized echo module shown in FIG. 7A is repeated each time with a different number N of refocusing sub-modules 703. The delay time $\tau$ is adjusted so that the total time between the start of the RF excitation pulse 701 and the center of the final echo (time 707) remains a constant length $T=2(N+1)\tau$. The maximum number of loops, N, can be as high as a few hundred.

Figure 8:
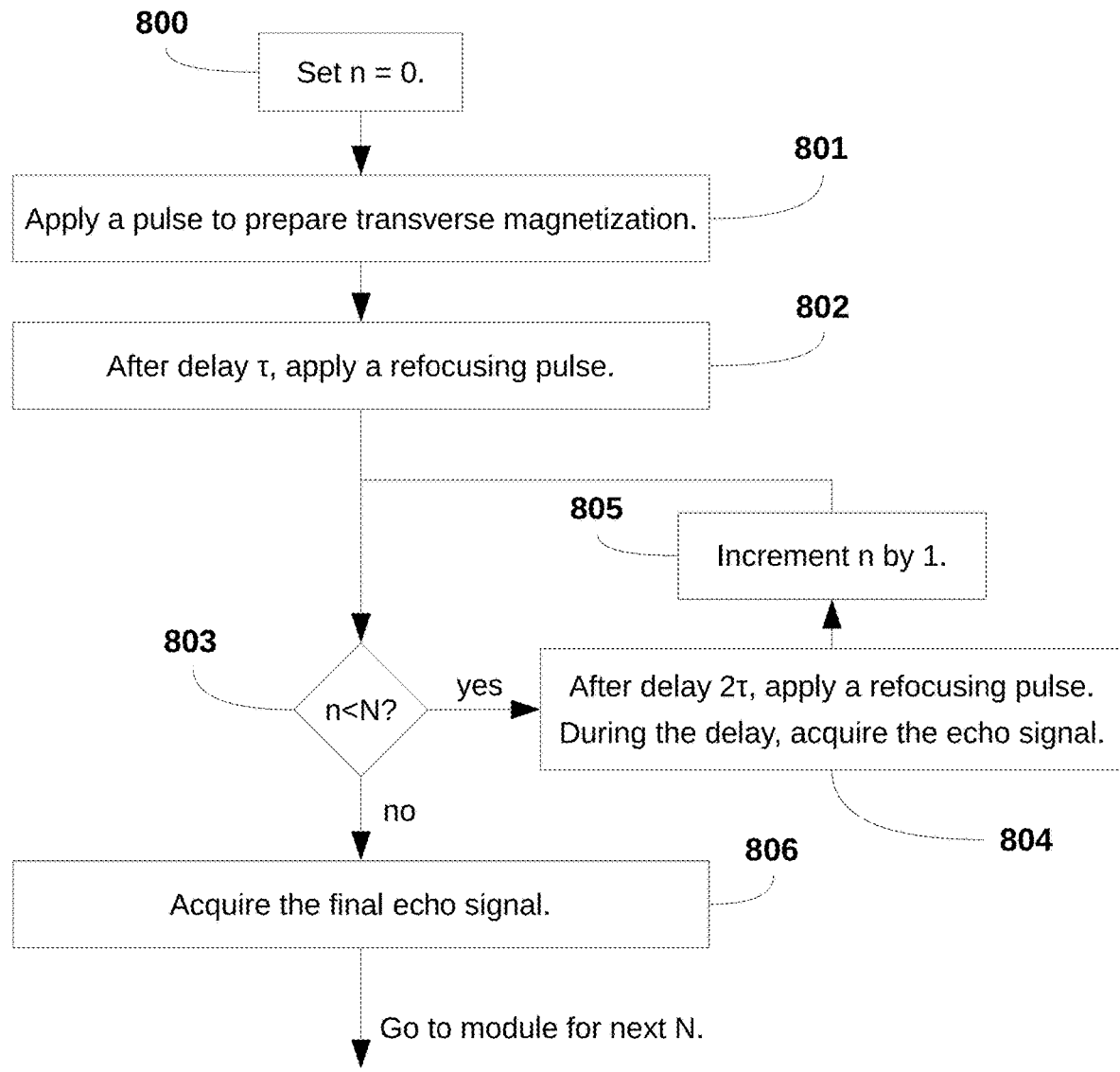
FIG. 8 is a flowchart to show the steps for pulse sequencing of FIGS. 7A-7C.
Figure 10A:
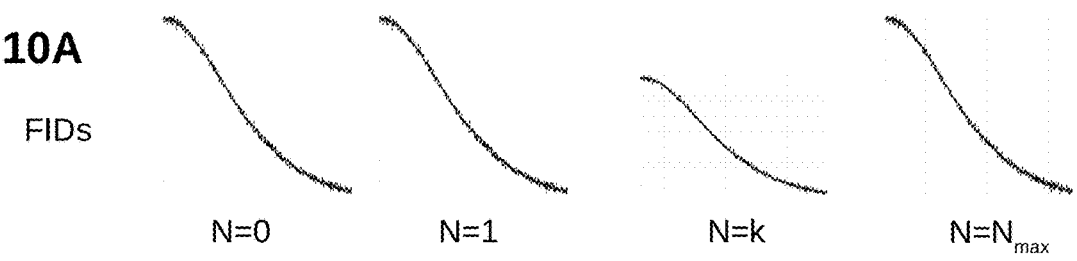
FIGS. 10A-10D show the procedure for creating a J-coupling spectrum from FID signals acquired for each number N of additional refocusing pulses according to the first embodiment.
Figure 10B:
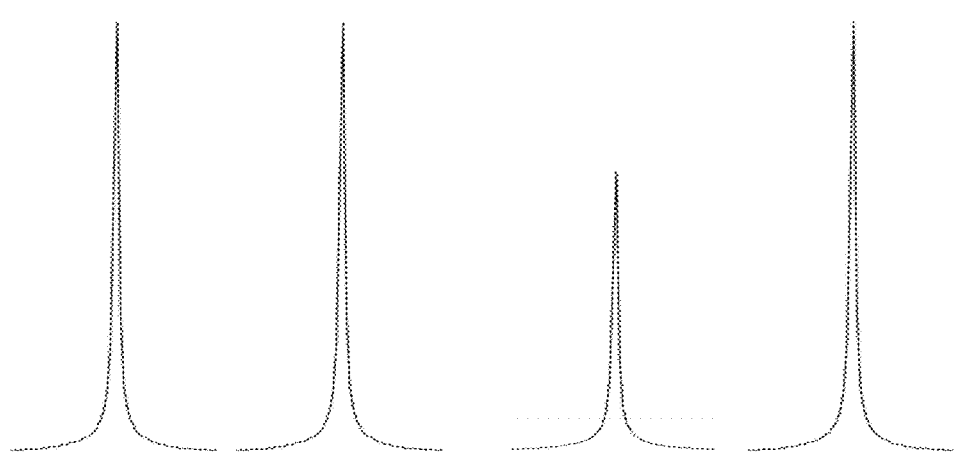
Figure 10C:
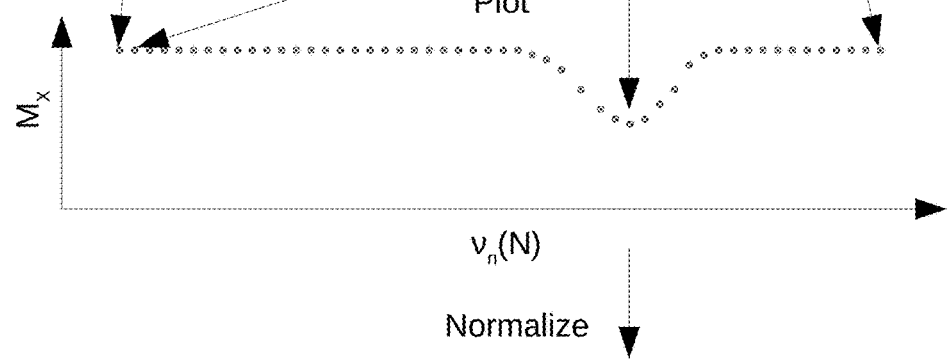
Figure 10D:
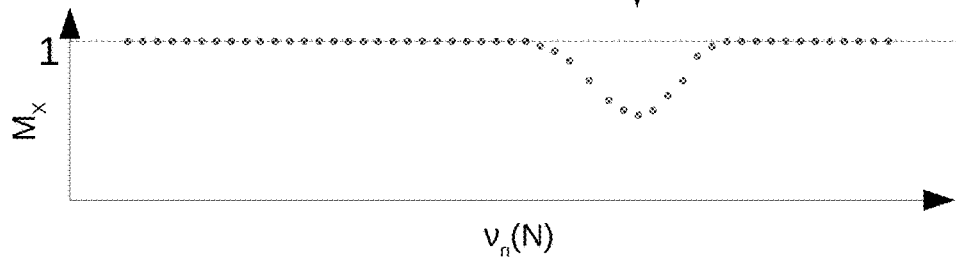

As shown in FIG. 8, pulse sequencing according to the second embodiment works as follows:

First, as shown in operation 800, a counter n is set to 0.

As shown in operation 801, the RF excitation pulse 701 is applied to the sample 404 at the NMR frequency to create transverse magnetization.

As shown in operation 802, after a delay $\tau$, the refocusing pulse 702 is applied at the NMR frequency.

As shown in operation 803, a decision is made. If the counter n is less than N, then in operation 804, the refocusing sub-module 703, is performed. The refocusing sub-module 703 is a delay $2\tau$, which is then followed by a refocusing pulse 704. During the delay $2\tau$, echo signal 705 is acquired and the detector 408 records the echo signal 705. The acquisition could be for the whole time during the delay $2\tau$, or for some limited time period during the delay $2\tau$. For the apparatus shown in FIG. 4, acquisition occurs when the T/R switch 405 is in receive mode, and the current induced in the RF coil 402 by the sample 404 is amplified by the preamplifier 407 and detected by the detector 408. Following operation 804, the counter n is incremented by 1 (operation 805) and the decision 803 is n<N is repeated.

In operation 803, if the counter n is not less than N, then operation 806 is carried out.

In operation 806, a final echo 706 is acquired. For the apparatus shown in FIG. 4, acquisition occurs when the T/R switch 405 is in receive mode, and the current induced in the coil 402 by the sample 404 is amplified by the preamplifier 407 and detected by the detector 408. Optionally, the final acquisition can be kept open for longer than the echo time to also collect FID signal. (The final acquisition does not need to be the same length as the other echo acquisitions, because it's length is no longer limited by the delay time $2\tau$.)

As in the first embodiment shown in FIGS. 5A-6, in this second embodiment, the first pulse 701 has a flip angle $\alpha=90°$ and the refocusing pulses 702, 704 have a flip angle $\alpha=180°$. However, this is not the only possible combination. For example, the first pulse could use a flip angle $\alpha<90°$.

As in the first embodiment shown in FIGS. 5A-6, in this second embodiment, the phase of the refocusing pulses is shifted 90° from the phase of the first pulse, but this is not the only possible combination.

Again, like in embodiment 1, the RF excitation pulse and each refocusing pulse can be a simple rectangular shape, a sinc shape, a Gaussian shape or composite shape. In most instances, although not necessarily, the rectangular and composite shaped pulses are used.

With respect to the first and second embodiments of FIGS. 5A-8, typical parameters, but not necessarily limited to the same, are such that:

a. all pulses are transmitted at the NMR resonance frequency of the spectral line.
b. The length T is between 0.5 s and 10 s.
c. $\tau$ is between 5 ms and 1.5 s.
d. the relationship between T and $\tau$ determines N, where $T=2(N+1)\tau$.

As previously described, FIGS. 9A-9D show examples of some pulse shapes that can be used in the pulse sequences. A rectangular function 901 as shown in FIG. 9A, a sinc function 902 as shown in FIG. 9B, or a Gaussian function 903 as shown in FIG. 9C can be used for the RF excitation pulse 701 or for refocusing pulses 702 and 704. A combination of pulse length and amplitude controls the flip angle. FIG. 9D shows an example of a composite pulse 904 that can be used as a refocusing pulse 702, 704. Multiple pulses are used to create the effect of a simple pulse. In this case, it is a sequence of rectangular pulses $90_y$-$180_x$-$90_y$. Many other pulse shapes and composite pulses can also be used, and these are just examples. Next, with respect to the first and second embodiments, a J-coupling spectrum is created using the information contained in the FID signals 505 or the echo signals 705, 706 (both the FID signals 505 and the echo signals 705, 706 are NMR signals acquired for each N). The delay time, $\tau$, corresponding to each N is converted to an equivalent spin-lock frequency, $v_n$, via the relationship $v_n=1/(4\tau)$. This corresponds to the frequency the J-synchronized echo module is sensitive to for a given N. N is related to the frequency by the relationship $N=2Tv_n-1$.

For the first embodiment, the measured signal acquired for each N is plotted vs. the corresponding $v_n$. The measured signal can be quantified from the FID signal 505 in different ways. The integral of the FID signal 505 could be taken directly, or a Fourier transform can be performed first and the resulting spectrum can be integrated (in magnitude or real mode). FIGS. 10A-10D show one example of the process. For each N, the FID signal 505 is converted to a conventional NMR spectrum via the Fourier transform, and the NMR spectrum is integrated to give a value 1(N). The integrals 1(N) are then plotted versus the equivalent spin-lock nutation frequency $v_n(N)$ to create a J-coupling spectrum. The J-coupling spectrum is normalized to its maximum value to create a baseline with a maximum value of 1.

For the second embodiment, an example of the process is shown in FIGS. 11A-11D. For each module N, the acquired echo signals 705, 706 are averaged to create an average echo signal. The average echo signal is integrated, and this integral is plotted vs. the corresponding values of $v_n(N)$ to create a J-coupling spectrum. The J-coupling spectrum is normalized to the maximum value of the J-coupling spectrum, which provides a baseline with a maximum value of 1.

Alternatively, for the second embodiment, a 2D spectrum is made. Instead of averaging the echo signals from each N, each individual echo is integrated, the time each echo was acquired is recorded, and a plot of the integrated echo signal (z-axis) vs. time (y-axis) and $v_n$ (x-axis) is made.

In performing the first and second embodiments discussed above, the following are at least some of the advantages that are achieved.

Dip intensity is twice what SLIC achieves. Further, the sequence is less sensitive to $B_0$ fluctuations and offsets as long as pulses have sufficient bandwidth to cover the range of frequency shifts caused by these $B_0$ fluctuations and offsets. $B_0$ can drift slowly due to temperature changes and current changes in an electromagnet, or change rapidly due to something like a truck driving by or a metal door opening. Also, there are often inhomogeneities so that $B_0$ isn't the same across the sample. And still further, composite pulses can make the J-synchronized echo method less sensitive to $B_1$ errors and offsets than SLIC. Like $B_0$, $B_1$ is not always the same across the sample, as there is often some $B_1$ inhomogeneity.

Figure 12A:
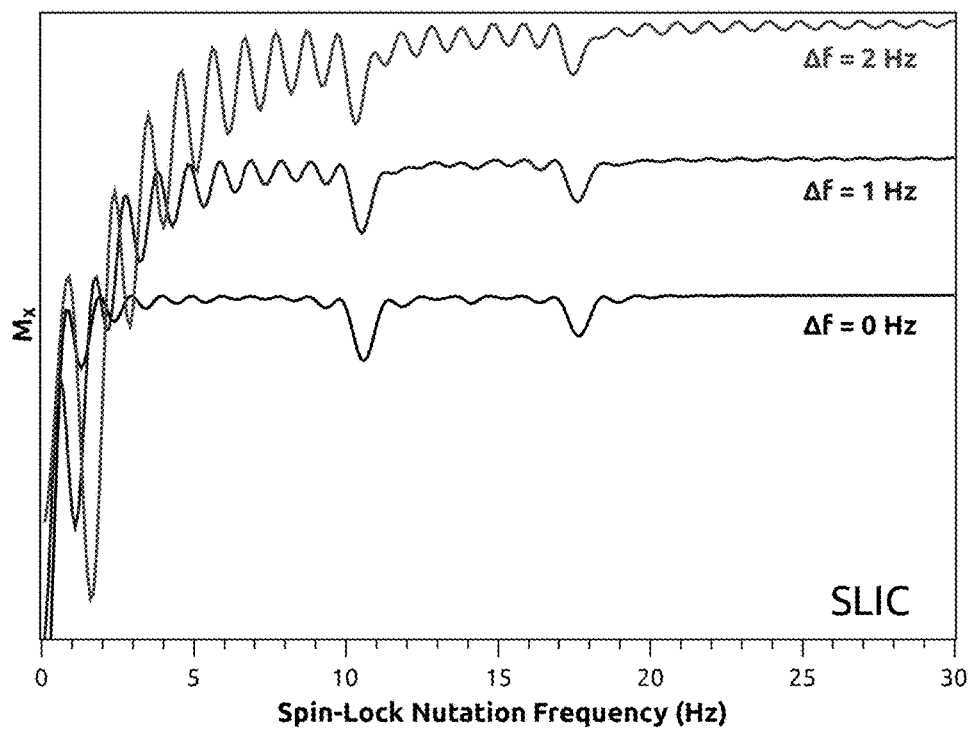
FIG. 12A is a simulation showing J-coupling spectra of hydrated ethanol acquired at three different $B_0$ offsets for the previous known SLIC.
Figure 12B:
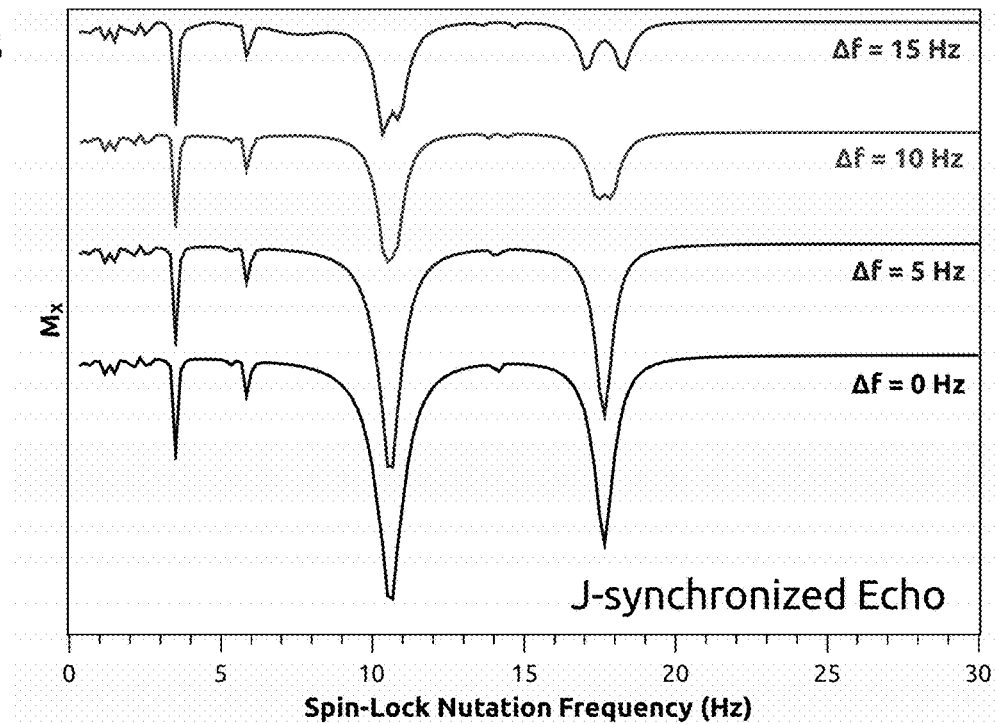
FIG. 12B shows a simulation for the same sample acquired with the J-synchronized echo method of the second embodiment using 2 ms long rectangular refocusing pulses.

FIGS. 12A-12B and 13A-13O show the effects of $B_0$ and $B_1$ offsets and comparing them with SLIC. FIG. 12A is a simulation showing J-coupling spectra of hydrated ethanol acquired with SLIC at three different $B_0$ offsets. ($B_0$ offset is quantified here as the corresponding frequency shift of the NMR frequency, $\Delta f$.) Even at only a 2 Hz offset, there are large oscillations that reduce the spectral quality and contrast-to-noise ratio. FIG. 12B shows a simulation for the same sample acquired with the J-synchronized echo method of the second embodiment using 2 ms long rectangular refocusing pulses. At 5 Hz offsets, there is no noticeable effect, and there is not significant line broadening and contrast reduction until about a 10 Hz offset.

Figure 13A:
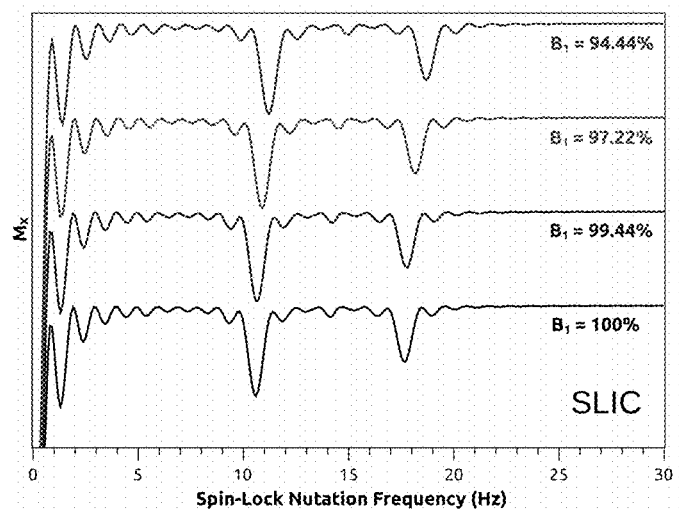
FIG. 13A shows a simulation showing J-coupling spectra of hydrated ethanol acquired with SLIC at four different $B_1$ offsets.
Figure 13B:
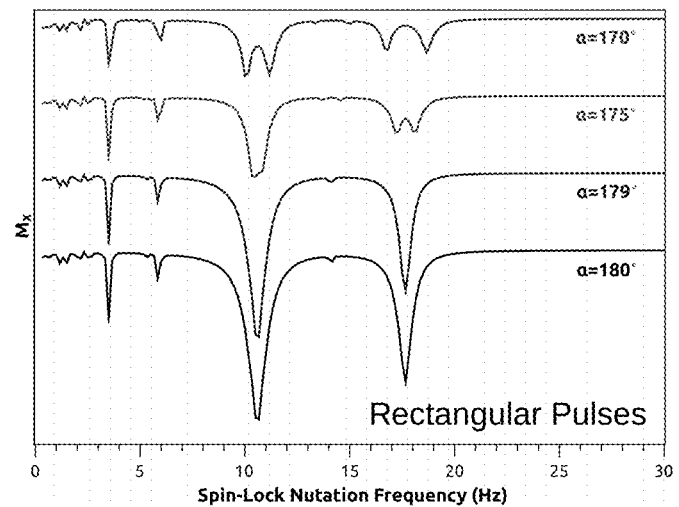
FIG. 13B shows a simulation for the same sample and offsets measured with the J-synchronized echo method of the second embodiment using rectangular refocusing pulses.
Figure 13C:
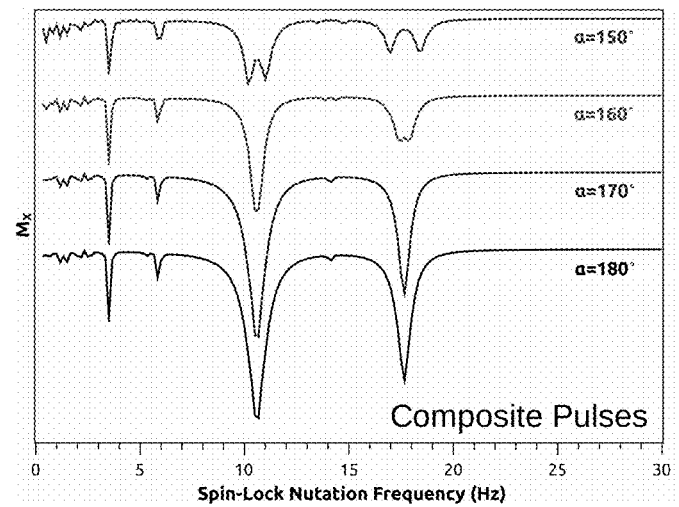
FIG. 13C shows simulations of the same measurement as in FIG. 13B using composite $90_y$-$180_x$-$90_y$ refocusing pulses.

FIG. 13A is a simulation showing J-coupling spectra of hydrated ethanol acquired with SLIC at four different $B_1$ offsets. The dip locations change in response, which could lead to the incorrect identification of the compound and incorrect measurement of the J-coupling value. FIG. 13B is a simulation for the same sample and offsets measured with the J-synchronized echo method of the second embodiment using rectangular refocusing pulses. For this method, $B_1$ errors create a broadening and splitting of the dips, but the center of the dip does not change. (Here, $B_1$ errors are quantified as the change in the flip angle that results from the corresponding decrease in $B_1$. For example, a pulse with flip angle $\alpha=170°$ corresponds with $B_1=94.44\%$, $\alpha=175°$ with 97.22%, $\alpha=179°$ with 99.44%, and $\alpha=180°$ with 100%.). FIG. 13C shows the same measurement using composite $90_y$-$180_x$-$90_y$ refocusing pulses. Much larger $B_1$ errors are tolerated.

Figure 3:
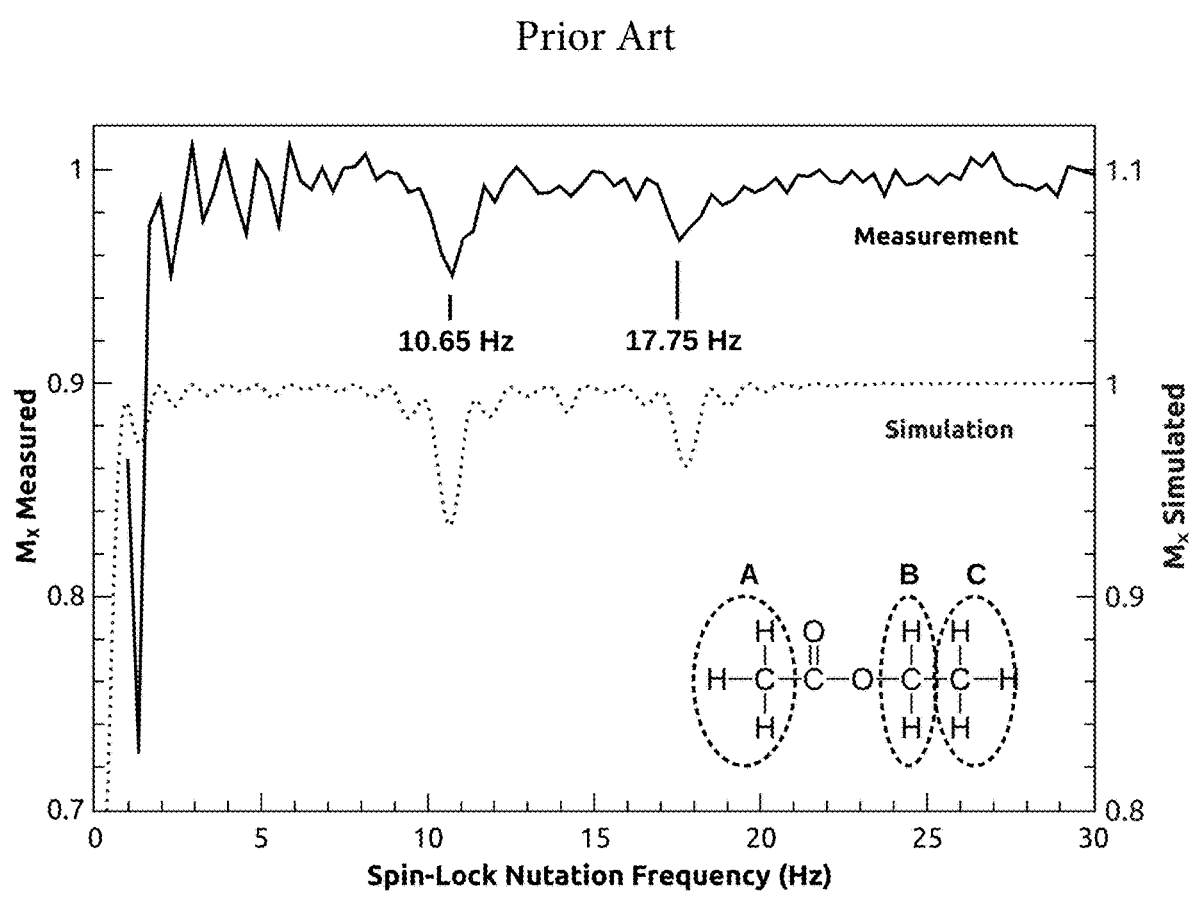
FIG. 3 provides an example of a J-coupling spectrum for ethyl acetate created with SLIC.
Figure 14:
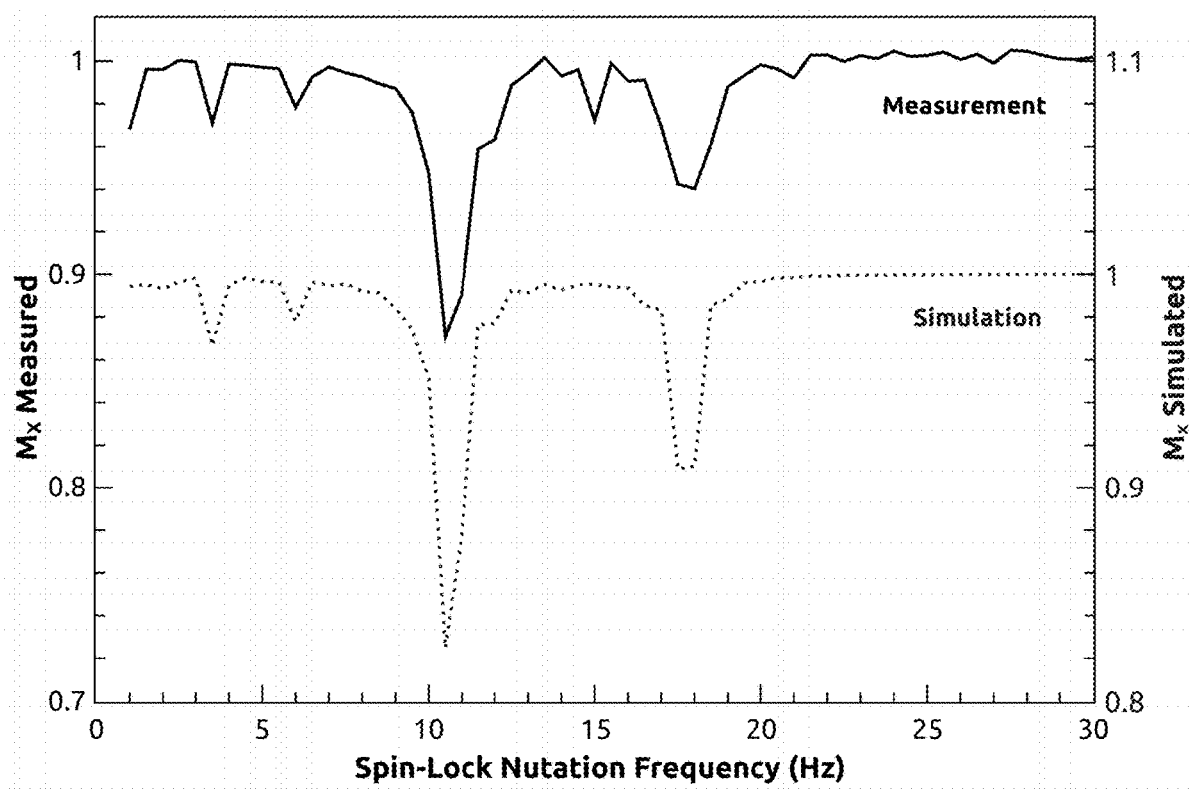
FIG. 14 is an example of a J-coupling spectrum for neat ethyl acetate acquired with the first embodiment.

FIG. 14 is an example of a J-coupling spectrum for neat ethyl acetate acquired in accordance with the first embodiment. The length T was 1 s so that it could be compared with the corresponding 1 s SLIC pulse (FIG. 3 results). The measured spectrum (solid line) matches well with a simulated spectrum (dotted line) created using literature values for chemical shift and scalar coupling strength. All data were acquired at 276 kHz (6.5 mT).

Figure 15:
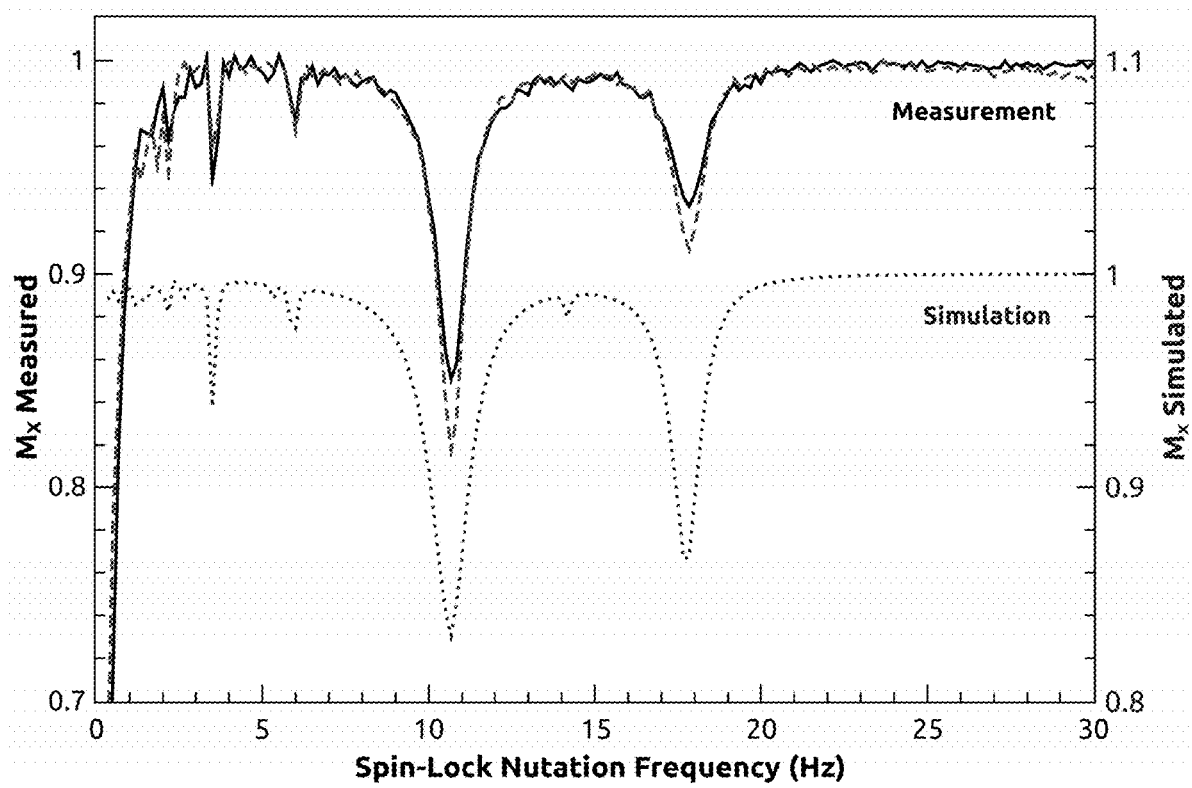
FIG. 15 reveals an example of a resulting 1D J-coupling spectrum for ethyl acetate acquired according to the second embodiment.

FIG. 15 reveals an example of a resulting 1D J-coupling spectrum for ethyl acetate acquired with the second embodiment. The length T was 3 s. Measured (solid) and simulated (dotted) J-coupling spectra of neat ethyl acetate acquired with the J-synchronized echo sequence of the second embodiment are shown. For the dashed trace, the rectangular refocusing pulses were replaced with composite $90_y$-$180_x$-$90_y$ refocusing pulses. All data were acquired at 276 kHz (6.5 mT).

Figure 16:
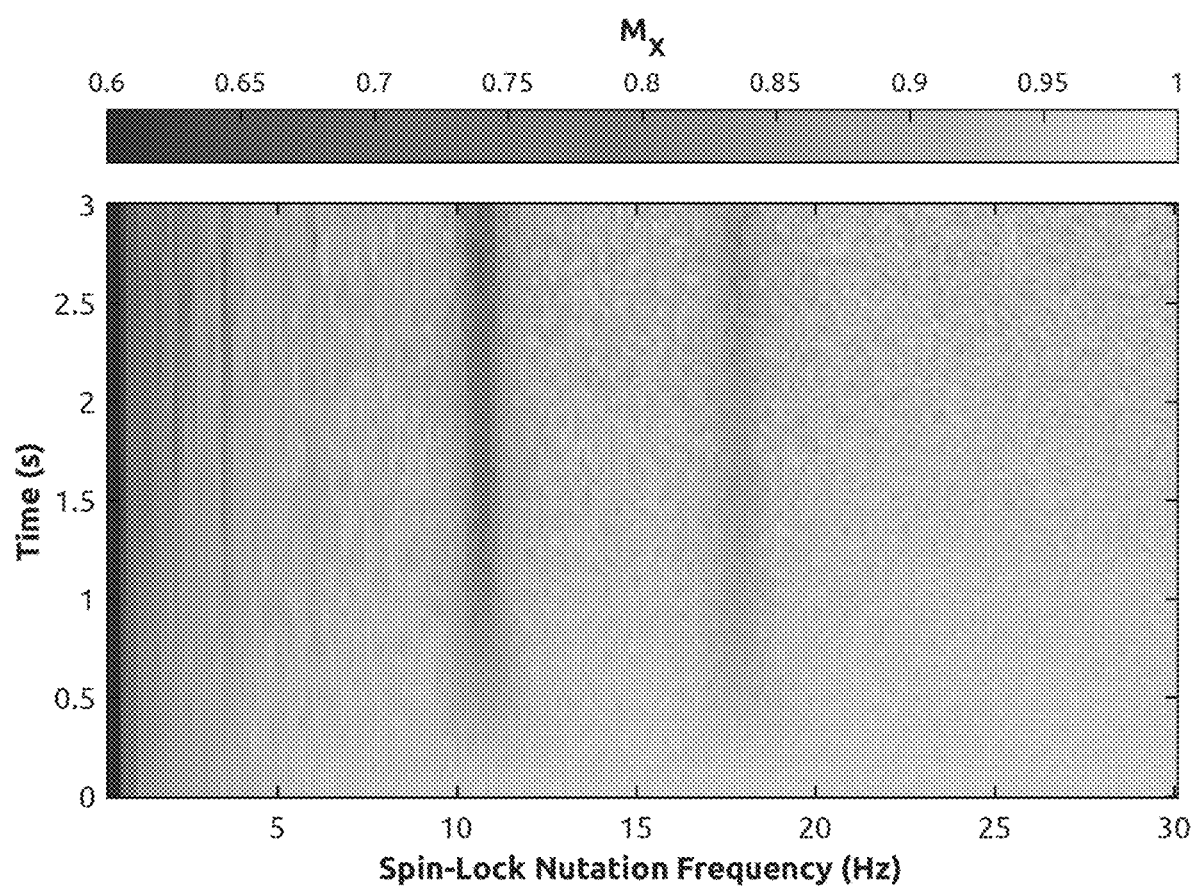
FIG. 16 shows a 2D spectrum of the same ethyl acetate data acquired for FIG. 15.

FIG. 16 shows a 2D spectrum of the same ethyl acetate data acquired for FIG. 15.

In the most straightforward replacement of spin-locking with a pulse train, a remaining transverse magnetization ($M_x$) would be detected following the full length of the SLIC pulse. However, a J-synchronized echo technique has the additional benefit of gaps between the refocusing pulses in which echo acquisitions can be collected. By measuring each echo, the dynamics at each step in the evolution around a Bloch sphere can be tracked while magnetization transfer is still occurring. This has two benefits. First, by measuring transverse magnetization over time, a rate of magnetization transfer can be measured and possibly used to determine chemical shift differences. In contrast, to perform the same type of measurement with SLIC would require repeated experiments with different evolution times. For 2D experiments, echo acquisition therefore greatly decreases the total experiment time. Second, the echo acquisitions can be averaged over time to create a 1D projection of the J-coupling spectrum. Averaging significantly reduces the noise compared with taking a single measurement at the end of the sequence. Moreover, the specific time points to average can be windowed to choose the periods with the strongest signals, thereby optimizing the contrast-to-noise ratio.

To create a J-coupling spectrum with J-synchronized echoes, data are acquired with sequences shown in FIG. 5 or FIG. 7 for a series of delay times. The equivalent nutation frequency for each measurement is $v_n=1/(4\tau)$. Given a set of desired values of $v_n$ to be measured, and their corresponding values of $\tau$, the number of repetitions N is chosen so that the total sequence time T is constant. Using a constant time T ensures that $T_2$ relaxation effects remain relatively constant throughout the experiment resulting in a smooth background for the J-coupling spectrum. $T_2$ is shorter for larger values of $\tau$, leading to smaller signals for low nutation frequencies, but the resulting background is easily removed. A constant T also ensures a constant linewidth for the dips, as the two are related through a Fourier relationship in the same way as for SLIC. The resolution of the J-coupling spectrum improves with experiment time and is given by $$\Delta v_n = \frac{1}{4T/2N + 2} - \frac{1}{4T/2N} = \frac{1}{2T}$$

The drawback of using a constant T is that because N must be integer valued, the nutation frequency points $v_n$ (and the associated frequency resolution) cannot be chosen arbitrarily as they can be for SLIC.

As noted above, aspects of the present invention relate to homonuclear J-coupling spectroscopy, wherein nuclear magnetic resonance (NMR) can be performed at lower magnetic fields than what was previously obtainable.

Homonuclear J-coupling spectroscopy enables NMR to be performed without requiring relatively large, heavy magnets, but instead is capable of the same or better performance at low magnetic fields.

Consequently, it becomes possible to make a small, portable spectrometer, a spectrometer on a chip, and instruments that work in the presence of ferromagnetic materials.

In contrast to what was done previously, according to aspects of the present invention, a total experiment time is kept constant, which it would not make sense to do for a $T_2$ measurement.

Using homonuclear J-coupling spectroscopy as discussed above, a spectrum is created by plotting a measurement vs. $v_n$, a function of delay time $\tau$, whereas a $T_2$ curve is created by plotting measurements vs. the time they were acquired. One way to measure $T_2$ is to acquire data with just one J-synchronized echo module from the second embodiment with a reasonable number of N (say >5). Then plot the magnitude of each collected echo vs. the time it was acquired. The result is a curve exponentially decaying with time constant $T_2$. In the processes of the first and second embodiments, $T_2$ is not of interest, so the data collected this way does not need to be analyzed in this manner, and acquisitions for different N are repeated to ultimately measure the spectrum of interest.

As a result, a J-coupling spectrum is created rather than a decay curve.

Another advantage according to aspects of the present invention, for the related art SLIC, $B_0$ had to be kept very stable, but the embodiments of the present invention have less stringent requirements. When the second embodiment is used, an achieved signal-to-noise is thirty (30) times better with the new sequence than with SLIC, resulting in a major improvement over the related art.

It should be understood that "one embodiment" or "an embodiment" mentioned in the whole specification does not mean that particular features, structures, or characteristics related to the embodiment are included in at least one embodiment of the present invention. Therefore, "in one embodiment" or "in an embodiment" appearing throughout the specification does not refer to a same embodiment. In addition, these particular features, structures, or characteristics may be combined in one or more embodiments in any appropriate manner.

A person of ordinary skill in the art may be aware that units and algorithm steps of the examples described in combination with the embodiments disclosed in this specification may be implemented by electronic hardware, computer software, or a combination thereof. To clearly describe the interchangeability between the hardware and the software, the foregoing has generally described compositions and steps of each example based on functions. Whether the functions are performed by hardware or software depends on particular applications and design constraints of the technical solutions. A person skilled in the art may use different methods to implement the described functions for each particular application, but it should not be considered that such an implementation goes beyond the scope of the present invention.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A method of performing homonuclear J-coupling spectroscopy on a sample, the method comprising:
   a) producing transverse magnetization in the sample by applying an RF excitation pulse at a nuclear magnetic resonance (NMR) frequency;
   b) after a delay $\tau$, applying a refocusing pulse to the sample;
   c) performing a step of, applying another refocusing pulse to the sample after a delay $2\tau$, N times, where N ranges from $N_{min}$ to $N_{max}$;
   d) following a final one of the refocusing pulses, acquiring an NMR signal from the sample; and
   repeating steps a)-c) for different values of N, adjusting $\tau$ so that a total time $T=2(N+1)\tau$ remains constant, where T is a time between a start of the RF excitation pulse and a center or a start of a final one of the NMR signals.

2. The method according to claim 1, wherein the NMR signal is a free induction decay (FID) signal.

3. The method according to claim 2, wherein an integral of the FID signal is taken directly, or a Fourier transform is performed first and a resulting spectrum is integrated.

4. The method according to claim 1, wherein the NMR signal is an echo signal.

5. The method according to claim 4, further comprising: after step a) and before step b), during the delay $2\tau$, acquiring another echo signal.

6. The method according to claim 5, wherein the acquiring of the another echo signal is during a whole time of the delay $2\tau$.

7. The method according to claim 5, wherein the acquiring of a final echo is not a same length as other echo signals.

8. The method according to claim 5, wherein, for each N, the echo signals are averaged to create an average echo signal.

9. The method according to claim 5, further comprising: measuring the transverse magnetization over time, wherein a rate of magnetization transfer is used to determine chemical shift differences between spins of the sample.

10. The method according to claim 1, wherein the RF excitation pulse has a flip angle $\alpha=90°$ and each refocusing pulse has a flip angle $\alpha=180°$.

11. The method according to claim 1, wherein a phase of each refocusing pulse is equal to a phase of the RF excitation pulse. pulse is shifted 90' from that of the RF excitation pulse.

12. The method according to claim 1, wherein a phase of each refocusing pulse is equal to a phase of the RF excitation pulse.

13. The method according to claim 1, where the RF excitation pulse and each refocusing pulse has a simple rectangular shape, a sinc shape, a Gaussian shape or a composite shape.

14. The method according to claim 1, wherein the RF excitation pulse and each refocusing pulse are transmitted at the NMR resonance frequency, wherein:
   a length of T is between 0.5 s and 10 s; and
   $\tau$ is between 5 ms and 1.5 s.

15. The method according to claim 1, wherein: $N_{min}$ and $N_{max}$ are determined from a range of frequencies $v_{n,min}$ to $v_{n,max}$ wherein: $v_n=1/(4\tau)$ and $T=2(N+1)\tau$, $N=2Tv_n-1$, $N_{min}=2Tv_{n,min}-1$ and $N_{max}=2Tv_{n,max}-1$.

16. The method according to claim 1, further comprising creating a J-coupling spec-trum based upon the acquired NMR signals.

17. A nuclear magnetic resonance frequency (NMR) device, comprising:
   a pulse sequence generator;
   a radio frequency (RF) coil;
   a detector; and
   a processor configured to:
      control the pulse generator to send a pulse transmission to the RF coil to cause the RF coil to:

a) apply an RF excitation pulse to a sample at a nuclear magnetic resonance (NMR) frequency to produce transverse magnetization in the sample;
b) after a delay τ, apply a refocusing pulse to the sample;
c) perform a step of, applying another refocusing pulse to the sample after a delay 2τ, N times, where N ranges from $N_{min}$ to $N_{max}$;
d) following a final one of the refocusing pulses, the detector acquires an NMR signal from the sample using the RF coil; and repeating steps a)-c) for different values of N, adjusting τ so that a total time T=2(N+1)τ remains constant, where T is a time between a start of the RF excitation pulse and a center or a start of a final one of the NMR signals.

18. The NMR device according to claim 17, wherein the NMR signal is a free induction decay (FID) signal.

19. The NMR device according to claim 17, wherein the NMR signal is an echo signal.

20. The NMR device according to claim 19, wherein: after step a) and before step b), during the delay 2τ, the detector detects another echo signal.

21. The NMR device according to claim 20, wherein the detector acquires the another echo signal during a whole time of the delay 2τ.

22. The NMR device according to claim 20, wherein the acquiring of a final echo signal is not a same length as other echo signals.

23. The NMR device according to claim 20, wherein, for each N, the processor averages the echo signals to create an average echo signal.

24. The NMR device according to claim 20, wherein:
the detector measures the transverse magnetization over time; and
the processor uses a rate of magnetization transfer to determine chemical shift differences of the samples.

25. The NMR device according to claim 17, wherein the RF excitation pulse has a flip angle α=90° and each refocusing pulse has a flip angle α=180°.

26. The NMR device according to claim 17, wherein a phase of each refocusing pulse is shifted 90° from that of the RF excitation pulse.

27. The NMR device according to claim 17, wherein a phase of each refocusing pulse is equal to a phase of the RF excitation pulse.

28. The NMR device according to claim 17, where the RF excitation pulse and each re-focusing pulse has a simple rectangular shape, a sinc shape, a Gaussian shape or a composite shape.

29. The NMR device according to claim 18, wherein the processor determines an integral of the FID signal directly, or performs a Fourier transform first and integrates a resulting spectrum.

30. The NMR device according to claim 17, wherein the pulse generator transmits RF excitation pulse and each refocusing pulse at the NMR resonance frequency, wherein:
a length of T is between 0.5 s and 10 s; and
τ is between 5 ms and 1.5 s.

31. The NMR device according to claim 17, wherein the processor determines $N_{min}$ and $N_{max}$ from a range of frequencies $v_{n,min}$ to $v_{n,max}$, wherein: $v_n=1/(4\tau)$ and T=2(N+1)τ, N=2Tv$_n$−1, $N_{min}$=2Tv$_{n,min}$−1 and $N_{max}$=2Tv$_{n,max}$−1.

32. The NMR device according to claim 17, wherein the processor creates a J-coupling spectrum based upon the acquired NMR signals.

\* \* \* \* \*